(12) United States Patent
Kang et al.

(10) Patent No.: US 8,890,551 B2
(45) Date of Patent: Nov. 18, 2014

(54) TEST KEY STRUCTURE AND METHOD FOR MEASURING STEP HEIGHT BY SUCH TEST KEY STRUCTURE

(75) Inventors: Chih-Kai Kang, Tainan (TW);
Shu-Hsuan Chih, Kaohsiung (TW);
Sheng-Yuan Hsueh, Tainan (TW);
Chia-Chen Sun, Kaohsiung (TW);
Po-Kuang Hsieh, Kaohsiung (TW);
Chi-Horn Pai, Tainan (TW);
Shih-Chieh Hsu, New Taipei (TW)

(73) Assignee: United Microelectronics Corp., Science Based Industrial Park, Hsin-Chu (TW)

( * ) Notice: Subject to any disclaimer, the term of this patent is extended or adjusted under 35 U.S.C. 154(b) by 266 days.

(21) Appl. No.: 13/286,230

(22) Filed: Nov. 1, 2011

(65) Prior Publication Data
US 2013/0106448 A1 May 2, 2013

(51) Int. Cl.
*G01R 27/08* (2006.01)
*H01L 23/48* (2006.01)
*H01L 21/66* (2006.01)

(52) U.S. Cl.
CPC ..................................... *H01L 22/34* (2013.01)
USPC ......... 324/705; 324/207.17; 324/699; 257/48

(58) Field of Classification Search
CPC .............. H01L 29/7813; H01L 29/42368; H01L 29/66734; H01L 29/4236; H01L 29/407; H01L 29/0696
USPC ......... 324/705, 71, 699, 207.17; 257/750, 48, 257/324, 500; 438/199, 11, 14, 15, 18, 585
See application file for complete search history.

(56) References Cited

U.S. PATENT DOCUMENTS

| | | | | | |
|---|---|---|---|---|---|
| 5,496,758 | A | * | 3/1996 | Ema | 438/253 |
| 5,851,881 | A | * | 12/1998 | Lin et al. | 438/261 |
| 6,677,766 | B2 | * | 1/2004 | Mehrad et al. | 324/699 |
| 6,905,897 | B1 | * | 6/2005 | Hsu | 438/18 |
| 7,009,376 | B2 | * | 3/2006 | Chou et al. | 324/71.1 |
| 7,230,435 | B2 | * | 6/2007 | Kunikiyo et al. | 324/658 |
| 7,663,237 | B2 | * | 2/2010 | Peng et al. | 257/750 |
| 2006/0086971 | A1 | * | 4/2006 | Takahashi et al. | 257/324 |
| 2006/0094181 | A1 | * | 5/2006 | Yu et al. | 438/199 |
| 2006/0148198 | A1 | * | 7/2006 | Kim | 438/424 |
| 2013/0082318 | A1 | * | 4/2013 | Liu et al. | 257/324 |

OTHER PUBLICATIONS

U.S. Appl. No. 13/251,444, filed Oct. 2011, Liu et al.*

* cited by examiner

*Primary Examiner* — Arleen M Vazquez
*Assistant Examiner* — Neel Shah
(74) *Attorney, Agent, or Firm* — Winston Hsu; Scott Margo

(57) ABSTRACT

A test key structure for use in measuring step height includes a substrate, and a pair of test contacts. The substrate includes an isolation region and a diffusion region. The test contact pair includes a first test contact and a second test contact for measuring electrical resistances. The first test contact is disposed on the diffusion region and the second test contact is disposed on the isolation region.

20 Claims, 5 Drawing Sheets

TEST KEY STRUCTURE AND METHOD FOR MEASURING STEP HEIGHT BY SUCH TEST KEY STRUCTURE

BACKGROUND OF THE INVENTION

1. Field of the Invention

The present invention generally relates to a test key structure and a method for measuring a step height by using such test key structure. In particular, the present invention is directed to a test key structure for measuring electrical resistances and a method for measuring a step height by using such test key structure.

2. Description of the Prior Art

A smooth and flat silicon wafer is the basis for fabricating integrated circuits. Difference of levels formed by the elements in the silicon wafer, such as the height difference of the shallow trench isolation (STI) in the MOSFET adjacent to the active region, causes the uneven surface of the substrate, which is called "a step height." Such step height is critical to the quality of the semiconductor process.

This critical factor has influences in many aspects. For example, with respect to processes, the unevenness of the surface of the substrate is critical to the lithographic precision. Failure of the lithographic precision may cause defocus or distortion. With respect to elemental characters, the reliability of the element is influenced, too. For example, the evenness of the surface of the substrate is highly related to the junction leakage and other effects, such as the short channel effect (SCE) or the narrow width effect (NWE). As a result, in order to have a steady process control, such as for the chemical mechanical polishing or a lithographic procedure, a quick method to acquire the step height of the substrate without damaging the substrate is necessary.

There are certain known methods to acquire the step height of the substrate. For example, an atomic force microscope (AFM) may be used to observe the situation of the surface of the substrate. However, it is difficult to cover a sufficient surface within a limited time period.

Another method may also acquire the step height of the substrate, which is called a transmission electron microscopy (TEM). Albeit a transmission electron microscopy is more time-saving compared with the atomic force microscope, it is needed to destroy the substrate to acquire the sample. In light of no current method being able to acquire the step height of the substrate in a both quick and non-destructive way, the current solutions to acquire the step height of the substrate are still needed to be improved.

SUMMARY OF THE INVENTION

In view of this, the present invention proposes a test key structure and a method for measuring a step height by using such test key structure. The present invention at least has quick, precise and non-destructive features.

The present invention in a first aspect proposes a test key structure for use in measuring a step height. The test key structure of the present invention includes a substrate and a pair of test contacts. The substrate includes an isolation region and a diffusion region. The test contact pair includes a first test contact and a second test contact for measuring electrical resistances. The first test contact is disposed on the diffusion region and the second test contact is disposed on the isolation region. The step height of a substrate can be indirectly measured through this test key structure of the present invention.

The present invention in a second aspect proposes a method for measuring a step height. First, a test key structure including a first test contact, a second test contact and a step height disposed between the first test contact and the second test contact are provided. Second, a first test electrical resistance and a second test electrical resistance are respectively obtained by means of respectively measuring the first test contact and the second test contact. Then, a first test height corresponding to the first test electrical resistance and a second test height corresponding to the second test electrical resistance are respectively obtained by referring to a data base. Next, the step height is obtained by calculating the first test height and the second test height in a non-destructive way.

Because the corresponding first test height and the corresponding second test height are independently obtained through the first test contact and the second test contact, and the step height is obtained by calculating the difference of the first test height and the second test height in a non-destructive way, the present invention is able to acquire the step height of the substrate in a quick, precise and non-destructive way. The method of the present invention has many features so that the process control can be made in a quick, precise and non-destructive way.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a test key structure for measuring a step height on a substrate by a non-destructive way, such as the step height caused by a shallow trench isolation protruding from the surface of the substrate.

Figure 1:
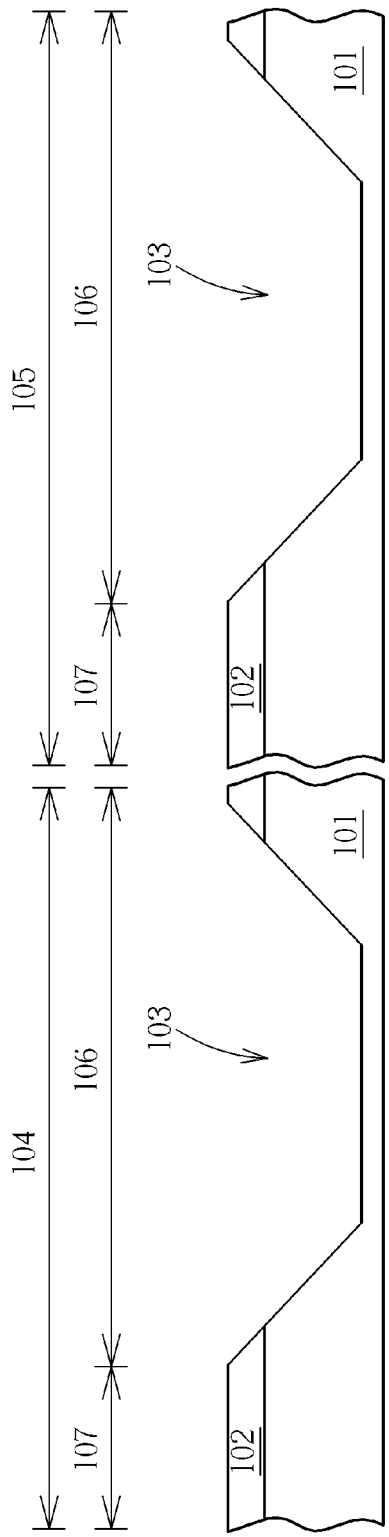
FIGS. 1-3 illustrate an embodiment of the method for forming the test key structure of the present invention.
Figure 2:
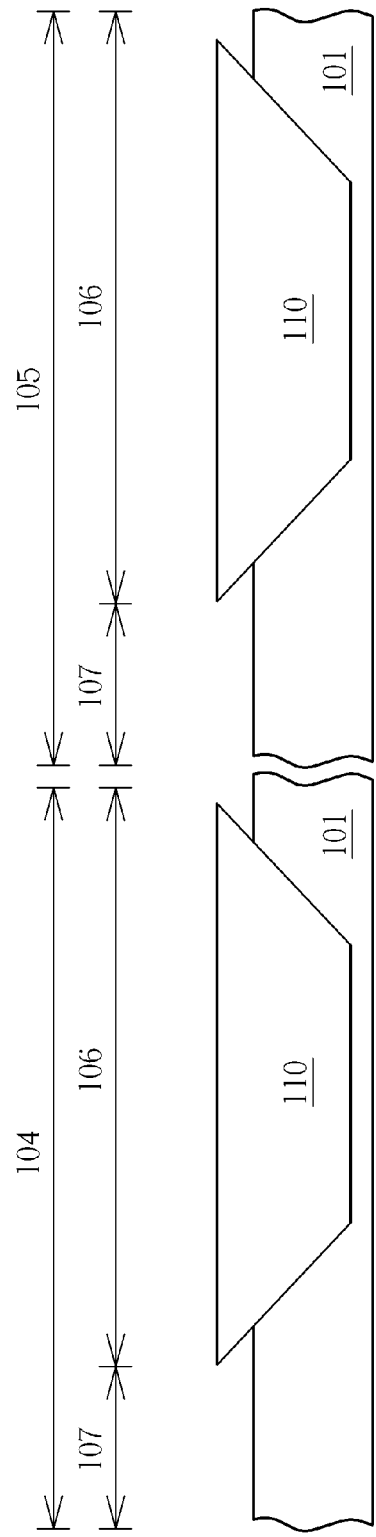
Figure 3:
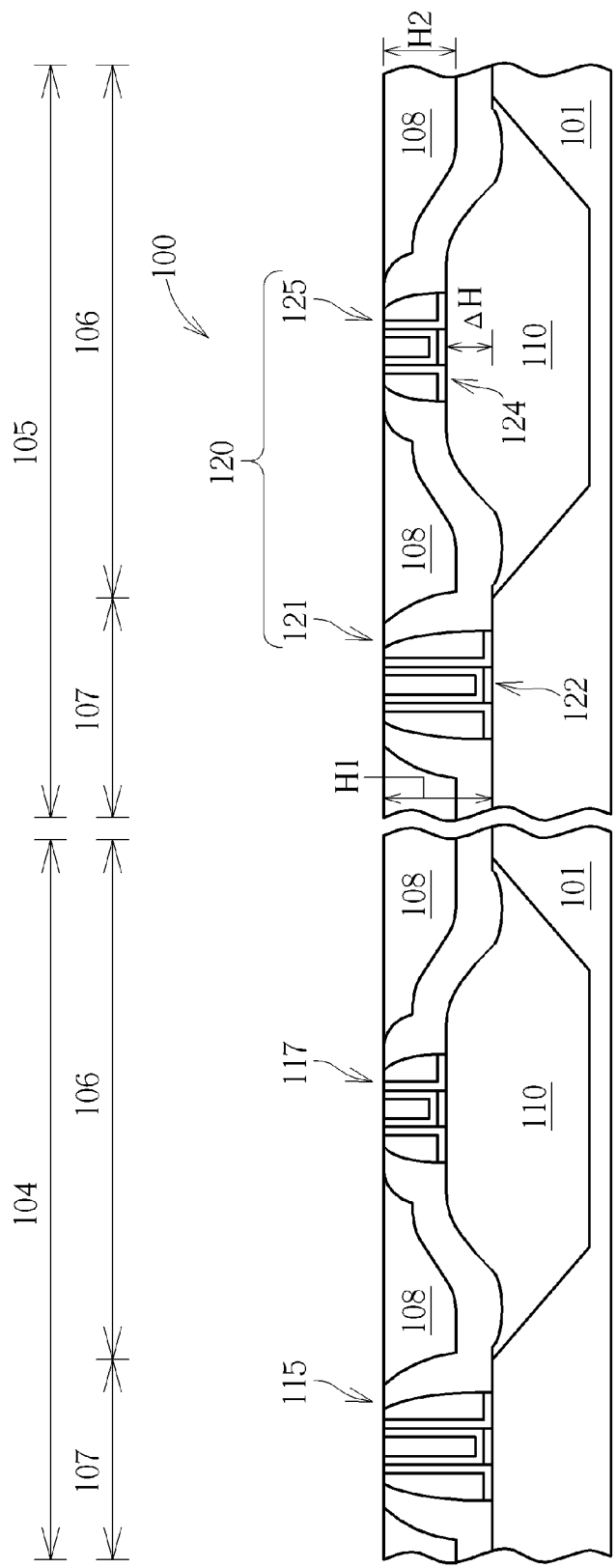

Please refer to FIGS. 1-3. FIGS. 1-3 illustrate an embodiment of the method for forming the test key structure of the present invention. First, as shown in FIG. 1, a hard mask 102 is used to form multiple trenches for use in a shallow trench isolation in a substrate 101. The substrate 101 may have a chip region 104 and a test key region 105, and each chip region 104 and test key region 105 may have an isolation region 106 and a diffusion region 107. In addition, the hard mask 102 may be a single film or a composite film including materials such as nitride or oxide.

Next, as shown in FIG. 2, an insulating material is used to fill the trenches 103, and the hard mask 102 is removed after the shallow trench isolation 110 is formed by planarization. Due to the thickness of the hard mask 102, the surface of the shallow trench isolation 110 in the isolation region 106 protrudes from the surface of the substrate 101 in both the chip region 104 and the test key region 105 to form a step height. In other embodiments, the shallow trench isolation 110 in the isolation region 106 may be other isolation elements, such as a field oxide layer (FOX) (not shown) formed by directly and locally oxidizing the surface of the substrate 101.

Next, as shown in FIG. 3, some further semiconductor processes are carried out, for example, ion wells in the substrate 101, a silicon gate structure, a source doping region (not shown) and a drain doping region (not shown) . . . etc. In addition, an insulating material is used to cover the Si gate structures to form an interlayer dielectric layer 108, followed by a chemical mechanical polishing procedure to remove excess insulating material till the Si gate structures are exposed. At the moment, the Si gate structures 115 in the chip region 104 are the gates of MOS and the Si gate structures 117 on the shallow trench isolation 110 may be elements such as passing gates, electrical resistances or eFuses.

Please note that the Si gate structures which are simultaneously formed in the test key region 105 along with the semiconductor processes becomes a pair of test contacts 120 of the present invention. The test contact pair 120 of the present invention includes at least a first test contact 121 and a second test contact 125 for measuring electrical resistances. The locations of the first test contact 121 and the second test contact 125 in the test key region 105 are not the same, for example, respectively disposed on the isolation region 106 and on the diffusion region 107. Because the surface of the shallow trench isolation 110 protrudes from the surface of the substrate 101, a step height hence exists. Therefore, a bottom side 122 of the first test contact 121 and a bottom side 124 of the second test contact 125 do not share the same plane. Further, after a chemical mechanical polishing procedure, the top side of the first test contact 121 and the top side of the second test contact 125 share the same plane, so the thickness of the first test contact 121 is different from that of the second test contact 125. As shown in FIG. 3, the thickness of the first test contact 121 is greater than that of the second test contact 125 and the difference of the thickness is the step height.

Optionally, at least one Si gate structure in the chip region 104 and in the test key region 105 may be changed to become a metal gate structure by a gate-last process. Moreover, the needed source contact plugs (not shown) or the drain contact plugs (not shown) adjacent to the gate structures (both silicon and metal) or contact plugs electrically connected to the first test contact 121 and the second test contact 125 are respectively formed. For example, one or all of the first test contacts 121 and the second test contacts 125 are changed to become metal gate structures. The steps to form the metal gates may be as follows. First, a gate trench is formed by etching in the Si gate structure. Second, a suitable metal, such as a work function metal layer, a barrier layer, Al or Cu, is used to fill up the gate trench and to simultaneously cover the interlayer dielectric layer 108. Then, a chemical mechanical polishing procedure is used to remove excess metal till the interlayer dielectric layer 108 is exposed to obtain the metal gate structures. After the steps, the first test contact 121 and/or the second test contact 125 are independently a Si gate structure or a metal gate structure.

Through the above steps, a Si gate structure and/or a metal gate structure in the chip region 104 and a test key structure 120 in the test key region 105 corresponding to the Si gate structure and/or the metal gate structure in the chip region 104 of the present invention are obtained. Because the thickness difference of each gate structure and test contact in the chip region 104 and in the test key region 105 is the step height due to the protruding shallow trench isolation, the test key structure 100 of the present invention may correspondingly simulate and measure the step height in the chip region 104. The test key structure 100 of the present invention includes a substrate 101 and a pair of test contacts 120. The substrate 101 includes a chip region 104 and a test key region 105 which is adjacent to the chip region 104. Each chip region 104 and test key region 105 may have an isolation region 106 and a diffusion region 107. The isolation region 106 may be a shallow trench isolation 110 embedded in the substrate 101 or a field oxide layer (FOX).

Still as shown in FIG. 3, the test contact pair 120 of the present invention includes two test contacts, namely a first test contact 121 and a second test contact 125 for measuring electrical resistances. For example, the first test contact 121 is disposed on a diffusion region 107, such as an ion well, a source doping region and a drain doping region, without directly contacting the isolation region 106. In other words, the first test contact 121 is surrounded by the diffusion region 107. The second test contact is disposed on the isolation region 106 without directly contacting the diffusion region 107. One of the first test contact 121 and the second test contact 125 surrounds the other and there is an interlayer dielectric layer 108 disposed between the first test contact 121 and the second test contact 125. The test key structure 100 of the present invention may be used to carry out tests such as a wafer acceptance test (WAT) and to acquire the step height of a substrate indirectly.

If the first test contact 121 has a height $H_1$ and the second test contact 125 has a height $H_2$, the height difference $\Delta H$ between the first test contact 121 and the second test contact 125 is the step height ($\Delta H = H_1 - H_2$).

Figure 4:
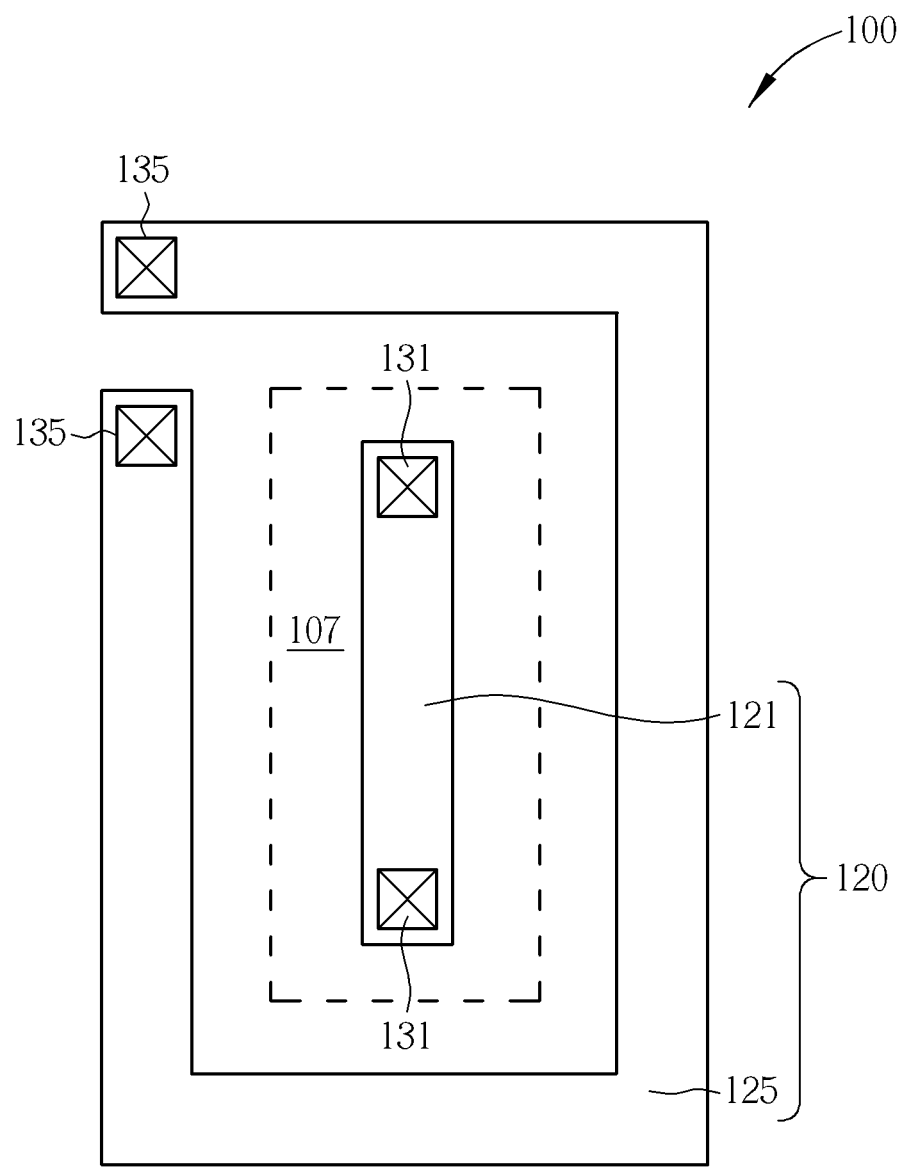
FIG. 4 illustrates a top view of an embodiment of the test key structure of the present invention.

Moreover, the first test contact 121 and the second test contact 125 in the test key structure 100 of the present invention may have different layouts. Please refer to FIG. 4. FIG. 4 illustrates a top view of an embodiment of the test key structure of the present invention. The test key structure 100 of the present invention includes a pair of test contacts 120. The test contact pair 120 of the present invention includes two test contacts, namely a first test contact 121 and a second test contact 125 for measuring electrical resistances. The first test contact 121 is in a form of strip and surrounded by a diffusion region 107. Further, the second test contact 125 is disposed around the first test contact 121 and surrounds the first test contact 121 and the diffusion region 107. The first test contact 121 and the second test contact 125 respectively have a conductive plug 131/135 for outward electric connection.

Please note that FIG. 4 is for illustration purpose only and the conductive plugs 131/135 are not limited to be disposed at the ends of the first test contact 121 and the second test contact 125. Similarly, the relative length of the first test contact 121 and the second test contact 125 are not limited, either.

Because the gate conductor in the gate has an electrical property, for example "a sheet resistance," and the sheet resistance is highly related to the thickness of the conductive material, i.e. the height of the gate conductor, theoretically speaking, under the same gate channel the higher the gate conductor, the larger the cross-sectional area and the smaller the sheet resistance is. As a result, the present invention is able to acquire the thickness of the gate conductor as well as the step height on the substrate by measuring the sheet resistance of the test key structure in a non-destructive way. For example, through the conductive plug 131 the sheet resistance of the first test contact 121 is measured to be $\rho_1$, so its height is derived to be $H_1$. Similarly, and through the conductive plug 135 the sheet resistance of the second test contact 125 is measured to be $\rho_2$, so its height is derived to be $H_2$. Because in this embodiment, the height $H_1$ is larger than the height $H_2$, the difference of the height $H_1$ and the height $H_2$ is the step height $\Delta H$.

Figure 5:
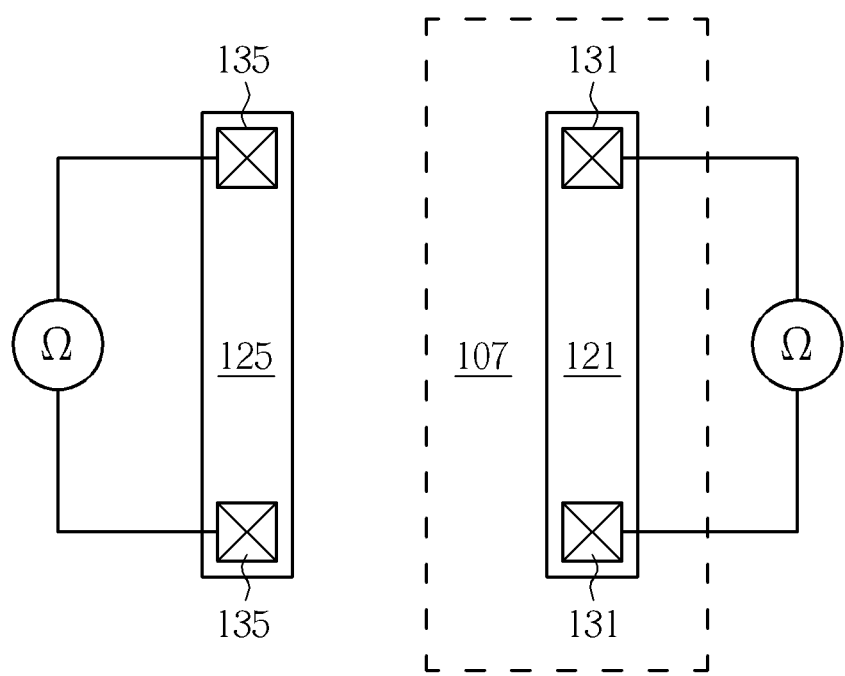
FIGS. 5-6 illustrate an embodiment to measure the step height on the substrate by the test key structure of the present invention.
Figure 6:
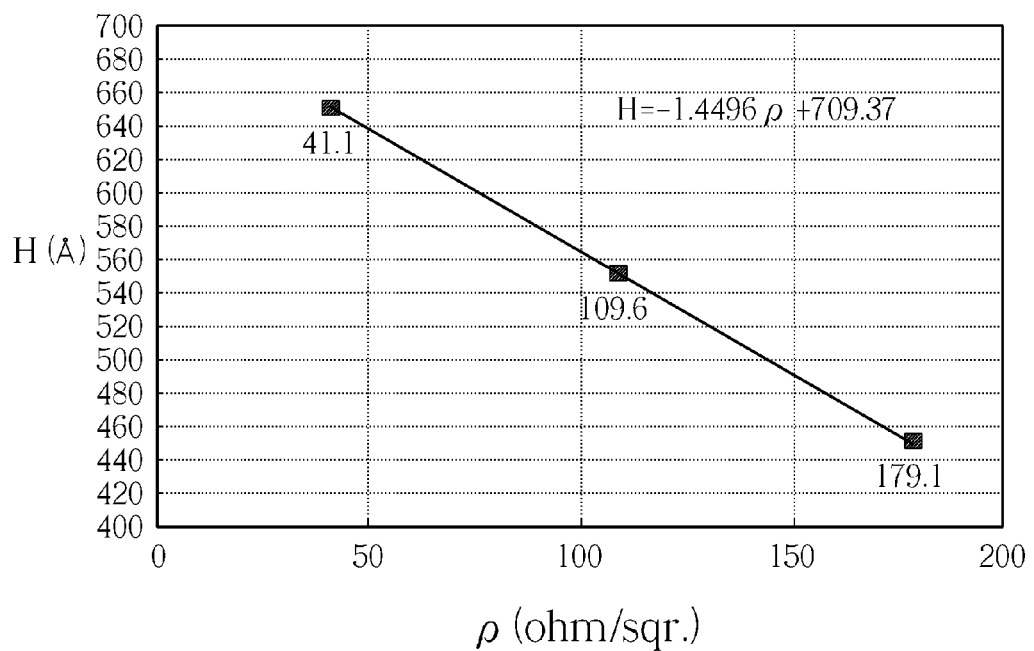

Accordingly, the present invention also provides a method to measure the step height on the substrate by the test key structure of the present invention. FIGS. 5-6 illustrate an embodiment to measure the step height on the substrate by the test key structure of the present invention. First, please refer to FIG. 3, a test key structure 100 is provided. Please refer to the above descriptions for the details of the test key structure of the present invention. Second, please refer to FIG. 5, a first test electrical resistance $\rho_1$ and a second test electrical resistance $\rho_2$ are respectively obtained by means of respectively measuring the first test contact 121 and the second test contact 125. The two $\rho_1$ and $\rho_2$ may be obtained by two-point probe measurement but not limited to this so four-point probe measurement is also possible. Then, please refer to FIG. 6, a database is provided. The database indicates the relationship of the test electrical resistance $\rho$ and the test height H. Consequently, a first test height $H_1$ corresponding to the first test electrical resistance $\rho_1$ and a second test height $H_2$ corresponding to the second test electrical resistance $\rho_2$ are obtained by referring to the data base. Next, the step height $\Delta H$ is obtained by independently calculating the first test height $H_1$ and the second test height $H_2$ in a non-destructive way.

For instance, the database for the reference of the test height may be obtained by the following way. For example, a substrate with multiple gate structures of different known heights is provided. The actual gate heights of the gate structures may be measured by the conventional methods, such as the destructive methods of the atomic force microscope (AFM) or the transmission electron microscopy (TEM). At the same time, the test electrical resistance of each gate structure is respectively measured by the test contacts. When sufficient samples are available, the database which integrates the electrical resistance $\rho$ versus the test height H is obtained, as shown in FIG. 5. Or alternatively, the database may be further organized to derive a formula which relates the electrical resistance $\rho$ to the test height H. For instance:

$$H = a\rho + k$$

wherein a is a parameter and k is a correction constant. In addition, the conductor in the test contacts may include different conductive materials, for example Al or Si. If the test contacts have different materials, the database as shown in FIG. 5 may also obtained in a similar way by providing samples of different heights and materials.

Besides, the test key structures made of different materials, for example the test key structures made of Al or the test key structures made of Si, may be measured as well. Theoretically speaking, although the step height $\Delta H$ is irrelevant to the materials which are used, the measurement may still be different in practice. However, in such a way, the step height $\Delta H$ which is derived from different materials may be used to estimate the error range of the step height $\Delta H$.

The step height, for instance 50 nm-60 nm, obtained from the above methods may be used to examine the reliability and quality of the semiconductors undergoing the manufacture. If the obtained step height fails to meet an expected value, for example being larger than an expected value or smaller than an expected value, a following step to correct the element may be initiated, or a step to provide feedback to adjust the previous manufacturing processes may be used to ensure the reliability and quality of the semiconductor.

Given the above, the present invention provides a test key structure and a method for measuring a step height on a substrate by using such test key structure. The present invention has the feature of at least two test contacts forming a pair to be disposed adjacent to a product element in order to indirectly examine in a quick, precise and non-destructive way if the step height meets an expected value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key structure, comprising:
   a substrate comprising a diffusion region and an isolation region;
   a shallow trench isolation disposed in said isolation region, said shallow trench isolation protruding from a surface of said substrate; and
   a pair of test contacts comprising a first test contact and a second test contact for measuring electrical resistances, wherein said first test contact is disposed on said diffusion region, said second test contact is disposed on said isolation region, said first test contact is a first gate structure, and said first gate structure contacts said surface of said substrate, wherein a thickness of said first test contact is greater than that of said second test contact.

2. The test key structure of claim 1, wherein said first test contact does not contact said isolation region and is one of a Si gate and a metal gate, and said second test contact comprises a second gate structure which does not contact said diffusion region and is one of a Si gate and a metal gate.

3. The test key structure of claim 1, wherein there is a step height between said diffusion region and said isolation region.

4. The test key structure of claim 1, wherein a top side of said first test contact and a top side of said second test contact share a plane.

5. The test key structure of claim 1, wherein said first test contact is surrounded by said diffusion region.

6. The test key structure of claim 1, wherein one of said first test contact and said second test contact surrounds the other.

7. The test key structure of claim 1, wherein two ends of said first test contact and said second test contact are respectively electrically connected to a contact plug.

8. The test key structure of claim 1, wherein a bottom side of said first test contact and a bottom side of said second test contact do not share the same plane.

9. A method for measuring a step height, comprising:
   providing a test key structure comprising a first test contact disposed on a diffusion region and a second test contact disposed on an isolation region and a step height disposed between said first test contact and said second test contact, wherein said first test contact is a first gate structure and said second test contact is a second gate structure, and wherein a thickness of said first test contact is greater than that of said second test contact;
   respectively obtaining a first test electrical resistance and a second test electrical resistance by means of respectively measuring said first test contact and said second test contact;
   obtaining a first test height corresponding to said first test electrical resistance and a second test height corresponding to said second test electrical resistance by referring to a data base; and
   obtaining the step height by calculating a difference of said first test height and said second test height in a non-destructive way.

10. The method for measuring a step height of claim 9, wherein said test key structure further comprises:
    a substrate comprising a diffusion region and an isolation, wherein said first test contact is disposed on said diffusion region without contacting said isolation region, and said second test contact is disposed on said isolation region without contacting said diffusion region.

11. The method for measuring a step height of claim 9, wherein said isolation region protrudes from the surface of said substrate to form said step height with said diffusion region.

12. The method for measuring a step height of claim 9, wherein a top side of said first test contact and a top side of said second test contact share a plane.

13. The method for measuring a step height of claim 9, wherein at least one of said first test contact and said second test contact is a metal gate.

14. The method for measuring a step height of claim 9, wherein at least one of said first test contact and said second test contact is a Si gate.

15. The method for measuring a step height of claim 9, wherein said first test contact is surrounded by said diffusion region.

16. The method for measuring a step height of claim 9, wherein one of said first test contact and said second test contact surrounds the other.

17. The method for measuring a step height of claim 9, further comprising:
providing a plurality of test contacts of different heights;
respectively obtaining a plurality of electrical resistances by means of respectively measuring said test contacts;
respectively measuring a plurality of said different heights of said test contacts; and
integrating said electrical resistances corresponding to said different heights to construct said data base.

18. The method for measuring a step height of claim 17, wherein measuring said different heights of said test contacts comprises destructively measuring said different heights of said test contacts.

19. The method for measuring a step height of claim 9, wherein a step is performed to correct an element when said step height does not meet an expectation.

20. The method for measuring a step height of claim 9, wherein a bottom side of said first test contact and a bottom side of said second test contact do not share the same plane.

* * * * *